US008563985B2

(12) United States Patent
Mochizuki

(10) Patent No.: US 8,563,985 B2
(45) Date of Patent: Oct. 22, 2013

(54) LIGHT-EMITTING DEVICE AND PROJECTOR

(75) Inventor: Masamitsu Mochizuki, Suwa (JP)

(73) Assignee: Seiko Epson Corporation (JP)

( * ) Notice: Subject to any disclaimer, the term of this patent is extended or adjusted under 35 U.S.C. 154(b) by 271 days.

(21) Appl. No.: 13/116,462

(22) Filed: May 26, 2011

(65) Prior Publication Data

US 2011/0303924 A1 Dec. 15, 2011

(30) Foreign Application Priority Data

Jun. 11, 2010 (JP) ................................ 2010-133681

(51) Int. Cl.
*H01L 29/15* (2006.01)
(52) U.S. Cl.
USPC ............................................. 257/76; 257/98
(58) Field of Classification Search
USPC ..................................................... 257/76, 98
See application file for complete search history.

(56) References Cited

U.S. PATENT DOCUMENTS

2008/0285609 A1* 11/2008 Ohta et al. ............... 372/44.011

FOREIGN PATENT DOCUMENTS

JP 2008-169060 7/2008

* cited by examiner

*Primary Examiner* — Douglas Menz
(74) *Attorney, Agent, or Firm* — Harness, Dickey & Pierce, P.L.C.

(57) ABSTRACT

A light-emitting device includes a first layer, a second layer, and a semiconductor body interposed between the first and second layers, wherein the semiconductor body has a first fine-wall-shape member, a second fine-wall-shape member, and a semiconductor member interposed between the first and second fine-wall-shape members, the first and second fine-wall-shape members have a third layer, a fourth layer, and a fifth layer interposed between the third and fourth layers, the fifth layer is a layer that generates light and guides the light, the third and fourth layers are layers that guide the light generated in the fifth layer, and the first and second layers are layers that suppress leakage of the light generated in the fifth layer.

16 Claims, 6 Drawing Sheets

LIGHT-EMITTING DEVICE AND PROJECTOR

BACKGROUND

1. Technical Field

The present invention relates to a light-emitting device and a projector.

2. Related Art

There is known a light-emitting device obtained by forming a light-emitting layer made of a group-III nitride semiconductor on a substrate, injecting a current from an external portion, and combining electrons and holes inside the light-emitting layer so as to emit light. In such a light-emitting device, a strain may be generated between a light-emitting layer and a substrate. Particularly, when InGaN is used in the light-emitting layer and materials other than InGaN (for example, GaN) are used in the substrate, lattice mismatch therebetween is generated and the strain increases. When such the strain is generated, an electric field due to a piezoelectric effect (piezoelectric field) is applied to the light-emitting layer, and a radiative recombination probability between electrons and holes is drastically reduced.

In order to address the aforementioned problem, for example, there has been proposed a method for relaxing a strain generated between the light-emitting layer and the substrate by forming the group-III nitride semiconductor using a fine columnar crystal structure as disclosed in JP-A-2008-169060.

However, according to the technique disclosed in JP-A-2008-169060, a side surface of a fine columnar crystal structure is exposed. Therefore, non-radiative recombination caused by an impurity or a defect near the side surface occurs, and light-emitting efficiency may be degraded.

SUMMARY

An advantage of some aspects of the invention is to provide a light-emitting device having high light-emitting efficiency. In addition, another advantage of some aspects of the invention is to provide a projector having the above light-emitting device.

According to an aspect of the invention, there is provided a light-emitting device including: a first layer having a first surface; a second layer having a second surface that faces the first surface; and a semiconductor body interposed between the first and second surfaces, wherein the structural body has a first fine-wall-shape member, a second fine-wall-shape member, and a semiconductor member, the first and second fine-wall-shape members having a third layer adjacent to the first surface, a fourth layer adjacent to the second surface, and a fifth layer interposed between the third and fourth layers, the semiconductor member is interposed between the first and second fine-wall-shape members, the first and second layers are made of GaN, the third, fourth, and fifth layers and the semiconductor member are made of $In_xGa_{1-x}N$ ($0<x<1$), a value x of the fifth layer is larger than values x of the third and fourth layers and the semiconductor member, the fifth layer is a layer that generates light and guides the light, the third and fourth layers are layers that guide the light generated in the fifth layer, the first and second layers are layers that suppress leakage of the light generated in the fifth layer, the semiconductor body has a third surface connecting the first and second surfaces and a fourth surface connecting the first and second surfaces and facing the third surface, the first and second fine-wall-shape members are arranged to extend from the third surface to the fourth surface as seen in a plan view from a normal direction of the first surface, at least one of the third and fourth surfaces is provided with an emitting surface, at least one of the first and second fine-wall-shape members and the semiconductor member configure at least a part of the emitting surface, and the emitting surface emits the light generated in the fifth layer.

In this light-emitting device, the semiconductor member is formed between the first and second fine-wall-shape members. For this reason, it is possible to suppress a non-radiative recombination on the side surface of the first and second fine-wall-shape members. Therefore, in this light-emitting device, it is possible to obtain high light-emitting efficiency while a strain generated between the substrate and the semiconductor body is relaxed. On the other hand, when such a semiconductor member is not provided and the side surface of the fine-wall-shape member is exposed, non-radiative recombination may occur due to an impurity or a defect in the vicinity of the side surface, and the light-emitting efficiency may be degraded.

Furthermore, in this light-emitting device, the semiconductor member is made of InGaN, and the first and second fine-wall-shape members are made of, for example, InGaN. For this reason, in comparison with a case where an insulation member made of, for example, silicon oxide or polyimide is formed between the first and second fine-wall-shape members, it is possible to make a thermal expansion coefficient of the first and second fine-wall-shape members and the semiconductor member close to each other. Therefore, in this light-emitting device, for example, even when heat is generated by a current injection, it is possible to reduce a stress applied to the semiconductor body due to thermal expansion, and suppress degradation of the light-emitting efficiency caused by the stress or reduction of lifetime.

According to another aspect of the invention, there is provided a light-emitting device including: a first layer having a first surface; a second layer having a second surface that faces the first surface; and a semiconductor body interposed between the first and second surfaces, wherein the semiconductor body has a first fine-wall-shape member, a second fine-wall-shape member, and a semiconductor member, the first and second fine-wall-shape members having a third layer adjacent to the first surface, a fourth layer adjacent to the second surface, and a fifth layer interposed between the third and fourth layers, the semiconductor member is interposed between the first and second fine-wall-shape members, the first and second layers are made of AlGaN, the third and fourth layers are made of GaN, the fifth layer and the semiconductor member are made of $In_xGa_{1-x}N$ ($0<x<1$), a value x of the fifth layer is larger than a value x of the semiconductor member, the fifth layer is a layer that generates light and guides the light, the third and fourth layers are layers that guide the light generated in the fifth layer, the first and second layers are layers that suppress leakage of the light generated in the fifth layer, the semiconductor body includes a third surface connecting the first and second surface and a fourth surface connecting the first and second surfaces and facing the third surface, the first and second fine-wall-shape members are arranged to extend from the third surface to the fourth surface as seen in a plan view from a normal direction of the first surface, at least one of the third and fourth surfaces is provided with an emitting surface, at least one of the first and second fine-wall-shape members and the semiconductor member configure at least a part of the emitting surface, and the emitting surface emits the light generated in the fifth layer.

In this light-emitting device, similarly, it is possible to obtain high light-emitting efficiency.

It is preferable that the light-emitting device may further include: a first electrode electrically connected to the first layer; a second electrode electrically connected to the second layer, and a sixth layer formed between the second layer and the second electrode. The sixth layer may make an ohmic contact with the second electrode, a contact surface between the sixth layer and the second electrode may be arranged to extend from the third surface to the fourth surface as seen in a plan view from a normal direction of the first surface, and at least one of the first and second fine-wall-shape members may be provided within the contact surface extending from the third surface to the fourth surface as seen in a plan view from a normal direction of the first surface.

In this light-emitting device, it is possible to emit the light generated in the active layer from the emitting surface without precisely adjusting the refractive index of the semiconductor member.

It is preferable that the semiconductor member may be formed on the opposite side of the first fine-wall-shape member to the second fine-wall-shape member and the opposite side of the second fine-wall-shape member to the first fine-wall-shape member.

In this light-emitting device, it is possible to more effectively suppress a non-radiative recombination on the side surfaces of the first and second fine-wall-shape members and to obtain high light-emitting efficiency.

It is preferable that the light-emitting device may be a super-luminescent diode.

In this light-emitting device, it is possible to suppress laser oscillation and reduce speckle noise when it is used in an image projection apparatus such as a projector or a light source of an image display apparatus.

It is preferable that the light-emitting device may further include a seventh layer formed to cover the emitting surface, wherein the seventh layer may be a layer that suppresses reflection of the light generated in the fifth layer.

In this light-emitting device, it is possible to reduce reflectance on the end surface of the semiconductor members and the fine-wall-shape members constituting the emitting face (at least one of the end surfaces of the first and second fine-wall-shape members). Accordingly, it is possible to avoid multiple reflection of light between the end surfaces of the first and second fine-wall-shape members. As a result, it is possible to suppress laser oscillation between the end surfaces in the first and second fine-wall-shape members.

It is preferable that a value x of the fifth layer may be equal to or larger than 0.4 and equal to or smaller than 0.6.

In this light-emitting device, it is possible to emit green light.

It is preferable that the third layer may be doped with a first conductivity type, and the fourth layer may be doped with a second conductivity type, and the semiconductor member may be undoped.

In this light-emitting device, the injection carriers (electrons and holes) can flow into the fine-wall-shape members avoiding the semiconductor member.

According to still another aspect of the invention, there is provided a projector including: the light-emitting device according to an embodiment of the invention; an optical modulator that modulates the light emission from the light-emitting device based on image information; and a projection device that projects an image formed by the optical modulator.

In this projector, it is possible to obtain high conversion efficiency of light from electricity.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, preferable embodiments of the invention will be described with reference to the accompanying drawings.

1. Light-Emitting Device

Figure 1:
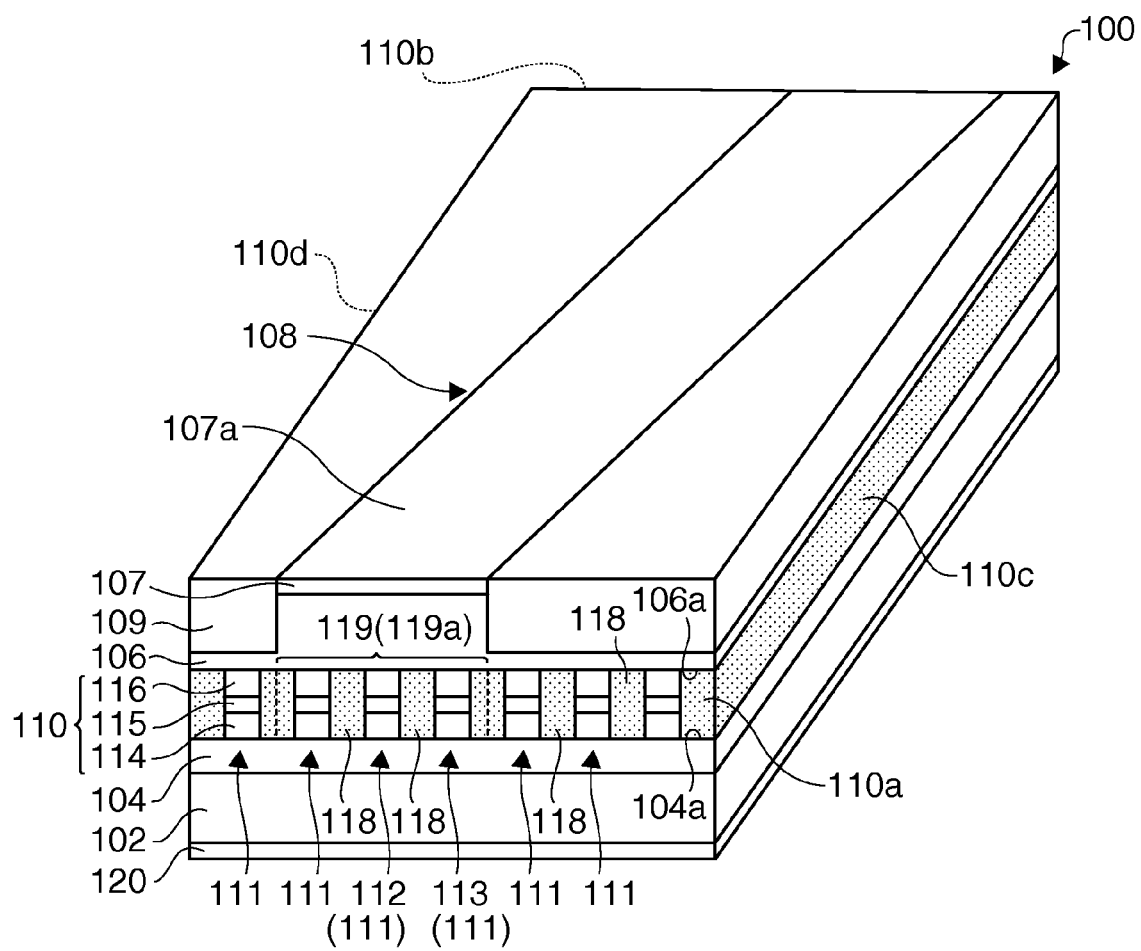
FIG. 1 is a perspective view schematically illustrating a light-emitting device according to an embodiment of the invention.
Figure 2:
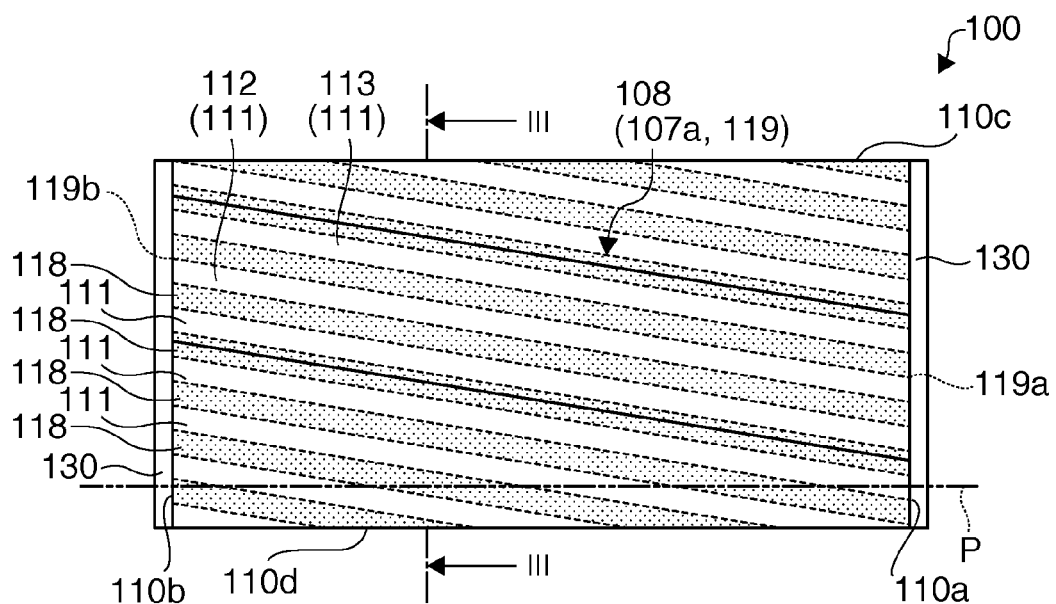
FIG. 2 is a plan view schematically illustrating a light-emitting device according to the embodiment of the invention.
Figure 3:
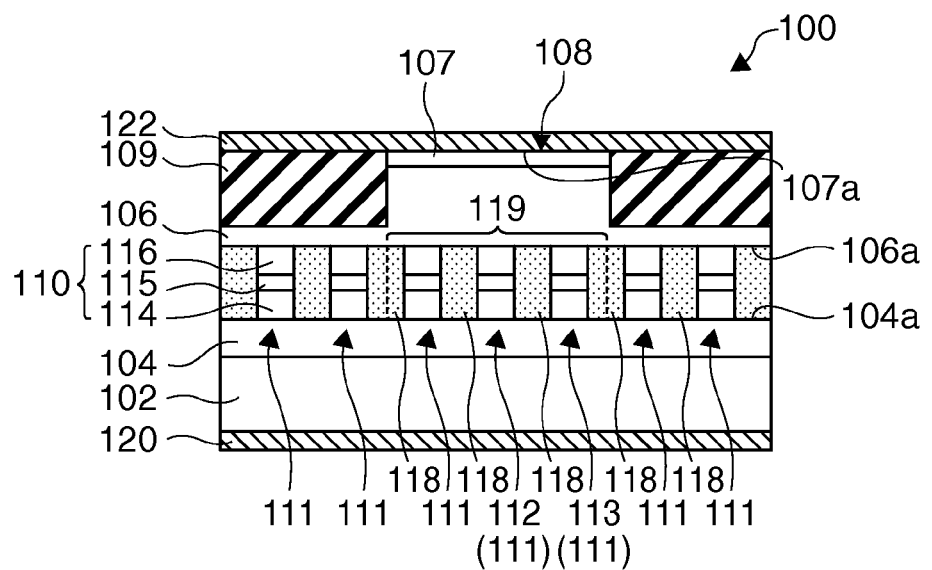
FIG. 3 is a cross-sectional view schematically illustrating a light-emitting device according to the embodiment of the invention.

First, a light-emitting device according to an embodiment of the invention will be described with reference to the accompanying drawings. FIG. 1 is a perspective view schematically illustrating a light-emitting device 100 according to an embodiment of the invention. FIG. 2 is a plan view schematically illustrating a light-emitting device 100 according to the embodiment of the invention. FIG. 3 is a cross-sectional view taken along the line III-III of FIG. 2 for schematically illustrating a light-emitting device 100 according to the embodiment of the invention. In addition, in FIG. 1, a second electrode 122 and a seventh layer 130 are omitted for the sake of convenience. In addition, in FIG. 2, a second layer 106, an insulating portion 109, and a second electrode 122 are transparently illustrated for the sake of convenience.

As an example, a case where a super luminescent diode (hereinafter, referred to as an SLD) is used as a light-emitting device 100 will now be described. The SLD can suppress laser oscillation by suppressing formation of a resonator unlike a semiconductor laser. For this reason, it is possible to reduce speckle noise when the SLD is used in an image projection apparatus such as a projector or a light source of an image display apparatus.

As shown in FIGS. 1 to 3, the light-emitting device 100 includes a first layer 104 (hereinafter, referred to as a "first cladding layer 104"), a second layer 106 (hereinafter, referred to as a "second cladding layer 106"), and a semiconductor body 110. Further, the light-emitting device 100 may include a substrate 102, a sixth layer 107 (hereinafter, referred to as a "contact layer 107"), a seventh layer 130 (hereinafter, referred to as an "anti-reflection layer" 130), an insulation member 109, a first electrode 120, and a second electrode 122.

As the substrate 102, for example, a first conductivity type (for example, n-type) GaN substrate or a GaN template substrate obtained by forming an n-type GaN layer on a sapphire substrate may be used.

The first cladding layer 104 is formed on the substrate 102. As the first cladding layer 104, for example, an n-type GaN layer may be used. In addition, although not shown in the drawings, a buffer layer may be formed between the substrate 102 and the first cladding layer 104. As the buffer layer, for example, an n-type GaN layer may be used. The buffer layer may improve crystal quality of an overlying layer.

The semiconductor body 110 is formed on the first cladding layer 104. The second cladding layer 106 is formed on the semiconductor body 110. For this reason, it can be said that the semiconductor body 110 is interposed between a first surface 104a (hereinafter, referred to as an upper surface 104a) of the first cladding layer 104 and a second surface 106a (hereinafter, referred to as a lower surface 106a) of the second cladding layer 106 facing the upper surface 104a.

The semiconductor body 110 has a rectangular shape (including a cube). The semiconductor body 110 may include a third surface (hereinafter, referred to as a first side surface 110a) and a fourth surface (hereinafter, referred to as a second side surface 110b) opposite to each other, and third and fourth side surfaces 110c and 110d that connect the first and second side surfaces 110a and 110b, respectively, and are opposite to each other. As shown in FIG. 1, it can be said that the first side surface 110a is a surface connecting the upper and lower surfaces 104a and 106a. Similarly, it can be said that the second side surface 110b of the semiconductor body 110 is a surface connecting the upper surface 104a of the first cladding layer 104 and the lower surface 106a of the second cladding layer 106.

In addition, it can be said that the normal line P of the first side surface 110a of the semiconductor body 110 is intersected with the normal line (not shown) of the upper surface 104a of the first cladding layer 104. Similarly, it can be said that the normal line (not shown) of the second side surface 110b of the semiconductor body 110 is intersected with the normal line of the upper surface 104a of the first cladding layer 104.

The semiconductor body 110 includes a fine-wall-shape member 111 and a semiconductor member 118. As shown in FIGS. 1 and 3, the fine-wall-shape member 111 includes a third layer 114 (hereinafter, referred to as a "first guiding layer 114"), a fourth layer 116 (hereinafter, referred to as a "second guiding layer 116"), and an active layer 115 having a fifth layer (hereinafter, referred to as a "quantum well layer").

The first guiding layer 114 is formed on the first cladding layer 104. It can be said that the first guiding layer 114 is adjacent to the upper surface 104a of the first cladding layer 104. The first guiding layer 114 may be formed, for example, using an n-type InGaN layer.

The active layer 115 is formed on the first guiding layer 114. It can be said that the active layer 115 is interposed between the first guiding layer 114 and the second guiding layer 116. The active layer 106 has a multiple quantum well (MQW) structure obtained by laminating three quantum well structures, for example, including a quantum well layer and a barrier layer. The quantum well layer is made of, for example, $In_{0.5}Ga_{0.5}N$, and the barrier layer is made of, for example, $In_{0.15}Ga_{0.85}N$. The thicknesses of the quantum well layer and the barrier layer are set to be, for example, from several nanometers to 10 nm.

The second guiding layer 116 is formed on the active layer 115. It can be said that the second guiding layer 116 is adjacent to the lower surface 106a of the second cladding layer 106. As the second guiding layer 116, for example, an InGaN layer of the second conductivity type (for example, p-type) may be used. The thicknesses of the first guiding layer 114 and the second guiding layer 116 are larger than that of the quantum well layer and the barrier layer, and are set to be, for example, several tens of nanometers to several hundreds of nanometers.

In the example of FIG. 1, the fine-wall-shape member 111 has a straight erected wall-like shape (plate shape) with respect to the upper surface 104a of the first cladding layer 104. A plurality of fine-wall-shape members 111 may be formed, and the number of the fine-wall-shape members 111 is not particularly limited. In the example of FIG. 2, the fine-wall-shape members 111 are arranged with a constant interval to extend from the third side surface 110c to the fourth side surface 110d. However, it is not necessarily for the fine-wall-shape members 111 to be arranged with a constant interval, but the intervals of neighboring fine-wall-shape members 111 may be different from each other.

The neighboring first and second fine-wall-shape members 112 and 113 out of a plurality of fine-wall-shape members are arranged to extend from the first side surface 110a to the second side surface 110b. In the example of FIG. 2, the first and second fine-wall-shape members 112 and 113 are arranged to extend from the first side surface 110a to the second side surface 110b within the contact surface 107a, which is part of the surface of the contact layer 107 having contact with the second electrode 122, viewed from a normal direction of the upper surface 104a. As shown in FIG. 2, in addition to the first and second fine-wall-shape members 112 and 113, another fine-wall-shape member 111 may be arranged within the contact surface 107a. In addition, as long as at least one of the first and second fine-wall-shape members 112 and 113 is arranged within the contact surface 107a, part of or the entirety of the other fine-wall-shape member may be arranged out of the contact surface 107a.

The first and second fine-wall-shape members 112 and 113 have, for example, a parallelogram plane shape having longer and shorter sides. The longer sides of the fine-wall-shape members 112 and 113 may be in parallel with the side corresponding to the outer edge of the contact surface 107a as shown in FIG. 2 in a plan view. As long as the shorter sides of the fine-wall-shape members 112 and 113 have a length equal to or smaller than several hundreds of nanometers, the length or height of the longer side (for example, a thicknesswise length of the active layer 115) is not particularly limited. However, as the lengths of the longer and shorter sides are reduced, the effect of relaxation of a strain generated in the semiconductor body 110 becomes significant. Particularly, the length of the shorter side is preferably set to be equal to or smaller than 250 nm. In this manner, since the lengths of the shorter sides of the fine-wall-shape members 112 and 113 have a nanometer scale, the fine-wall-shape members 112 and 113 may be referred to as "nano-wall 112 and 113." When the fine-wall-shape members 112 and 113 have a hexagonal crystal system, the direction of the longer side of the fine-wall-shape members 112 and 113 may be an a-axis direction of the hexagonal crystal system.

The semiconductor member 118 is disposed on the first cladding layer 104 and formed on the lateral side of the fine-wall-shape member 111. That is, the semiconductor member 118 is formed between the first and second fine-wall-shape members 112 and 113. Furthermore, the semiconductor member 118 is also formed on the opposite side of the first fine-wall-shape member 112 to the second fine-wall-shape member 113 (on the side toward the fourth side surface 110d) and the opposite side of the second fine-wall-shape member 113 to the first fine-wall-shape member 112 (on the side toward the third side surface 110c). The side surfaces of the first and second fine-wall-shape members 112 and 113 have contact with, for example, the semiconductor member 118. It can also be said that the semiconductor member 118 is formed to bury gaps between a plurality of fine-wall-shape members 111. It can also be said that a remaining area of the semiconductor body 110 except for the fine-wall-shape member 111 is occupied by the semiconductor member 118.

A material of the semiconductor member 118 may be, for example, undoped InGaN. Since the semiconductor member 118 is undoped, and the first and second guiding layers 114 and 116 of the fine-wall-shape member 111 are doped as described above, the injection carriers (electrons and holes) can flow into the fine-wall-shape member 111 avoiding the semiconductor member 118.

Part of the active layer 115, part of the guiding layers 114 and 116, and part of the semiconductor member 118 may constitute a waveguide 119 as shown in FIGS. 1 to 3. The active layer (quantum well layer) 115 of the first and second fine-wall-shape members 112 and 113 can emit light, and this light can propagate through the waveguide 119. As shown in FIGS. 1 to 3, the waveguide 119 may be arranged along the columnar portion 108 to extend from the first side surface 110a to the second side surface 110b as seen in a plan view. It can also be said that the waveguide 119 is arranged along the contact surface 107a of the contact layer 107 having contact with the second electrode 122. Although not shown in the drawings, a plurality of waveguides 119 may be provided.

The contact surface 107a has the same plane shape as the columnar portion 108 or is included in the columnar portion 108 in a plan view as shown in FIG. 2. Since the waveguide 119 is arranged along the columnar portion 108, it can be said that the contact surface 107a is included in the waveguide 119 as seen in a plan view. Meanwhile, as described above, at least one of the first and second fine-wall-shape members 112 and 113 is included in the contact surface 107a as seen in a plan view. Therefore, at least one of the first and second fine-wall-shape members 112 and 113 is included in the waveguide 119 as seen in a plan view. In the illustrated example, the first and second fine-wall-shape members 112 and 113 and the semiconductor member 118 between the first and second fine-wall-shape members 112 and 113 constitute a waveguide 119. The direction of the longer sides of at least one of the first and second fine-wall-shape members 112 and 113 included in the waveguide 119 is approximately equal to the direction connecting the center of the first end surface 119a (the end surface provided on the first side surface 110a) and the center of the second end surface 119b (the end surface provided on the second side surface 110b) of the waveguide 119 as seen in a plan view.

In the example of FIG. 2, the waveguide 119 is provided from the first side surface 110a to the second side surface 110b inclined against the normal line P. As a result, it is possible to avoid multiple reflection between the first end surface 119a formed on the first side surface 110a and the second end surface 119b formed on the second side surface 110b. As a result, it is possible to suppress laser oscillation between the first and second end surfaces 119a and 119b. In the example shown in FIGS. 1 and 2, part of the first and second end surfaces 119a and 119b is composed of the first and second fine-wall-shape members 112 and 113 and the semiconductor member 118 between the first and second fine-wall-shape members 112 and 113.

The anti-reflection layer 130 may be formed to cover at least one of the first and second end surfaces 119a and 119b of the waveguide 119. The anti-reflection layer 130 may be formed to cover the entire area of the first and second side surfaces 110a and 110b of the semiconductor body 110. It is possible to suppress reflection of light generated in the active layer 115 using the anti-reflection layer 130. That is, it is possible to reduce the reflectance on the end surfaces 119a and 119b to 0% or a value close to 0% using the anti-reflection layer 130. As a result, it is possible to effectively emit light from the end surfaces 119a and 119b (also, referred to as emitting surfaces 119a and 119b).

Although not shown in the drawings, only the first end surface 119a may be covered by the anti-reflection layer 130 and the second end surface 119b may be covered by a high reflection layer. As a result, part of the light generated in the active layer 115 is reflected by the second end surface 119b and then emit from the first end surface 119a. The anti-reflection layer 130 and the high reflection layer may be composed of, for example, an $Al_2O_3$ layer, a TiN layer, a $TiO_2$ layer, an SiON layer, an SiN layer, a $SiO_2$ layer, a $Ta_2O_3$ layer, a multilayered film thereof, or the like.

The second cladding layer 106 is formed on the semiconductor body 110. As the second cladding layer 106, for example, a p-type GaN layer may be used.

For example, a pin diode is configured using a p-type second cladding layer 106, an impurity-undoped active layer 115, and an n-type first cladding layer 104.

As described above, the cladding layers 104 and 106 may be made of GaN, and the active layer 115, the guiding layers 114 and 116, and the semiconductor member 118 may be made of $In_xGa_{1-x}N$ (0<x<1). As a result, the cladding layers 104 and 106 may be made of a layer having a forbidden bandgap larger than those of the active layer 115, the guiding layers 114 and 116, and the semiconductor member 118 and a refractive index smaller than those of the active layer 115, the guiding layers 114 and 116, and the semiconductor member 118. Furthermore, it is possible to increase the value x (the value of In against Ga) of the quantum well layer included in the active layer 115 to be larger than that of the guiding layers 114 and 116. As a result, it is possible to provide the guiding layers 114 and 116 having a forbidden bandgap larger than that of the quantum well layer and a refractive index smaller than that of the quantum well layer.

In addition, the active layer 115 can generate green light when the quantum well layer is made of $In_xGa_{1-x}N$ (0.4≤x≤0.6). Therefore, the light-emitting device 100 can emit green light.

In addition, as long as a relationship of the refractive index between each layer is maintained, a subcomponent such as Al may be mixed in each layer 104, 106, 114, and 116 containing the aforementioned composition as a main component. That is, the cladding layers 104 and 106 may be made of AlGaN, and the guiding layers 114 and 116 may be made of InAlGaN. In addition, as long as a relationship of the refractive index between each layer is maintained, the cladding layers 104 and 106 may be made of AlGaN, and the guiding layers 114 and 116 may be made of GaN. In addition, for example, the cladding layers 104 and 106 may have a super-lattice structure containing the AlGaN layer and the GaN layer, and the guiding layers 114 and 116 may be made of GaN or InGaN.

Using the aforementioned composition of each layer, the active layer 115 (quantum well layer) can generate light and have a function of amplifying the light. The active layer 115 also has a function of guiding the light. The guiding layers 114 and 116 have a function of guiding the light generated in the active layer 115. The cladding layers 104 and 106 have a function of suppressing leakage of the injection carriers (electrons and holes) and the light. The semiconductor member 118 also has a function of guiding light, but is different from the guiding layers 114 and 116 in that the injection carriers flow avoiding the semiconductor member 118.

More specifically, in the light-emitting device 100, when a forward bias voltage of a pin diode is applied between the first and second electrodes 120 and 122, electrons and holes are injected to the active layer 115 by way of the guiding layers 114 and 116 avoiding the semiconductor member 118, and a recombination between electrons and holes occurs in a portion of the active layer 115 corresponding to the waveguide 119. This recombination generates light. Originating from the generated light, stimulus emission occurs in a chain manner so that the intensity of light inside the active layer 115 of the waveguide 119 is amplified. For example, a part of the light generated in the active layer 115 of at least one of the first and second fine-wall-shape members 112 and 113 included in the waveguide 119 may propagate through at least one of the first and second fine-wall-shape members 112 and 113 and the semiconductor member 118 and be emitted from the end surfaces 119a and 119b as the emitting light. In the example of FIGS. 1 and 2, a part of the light generated in the active layer 115 of the first and second fine-wall-shape members 112 and 113 may propagate through the first and second fine-wall-shape members 112 and 113 and the semiconductor member 118 and be emitted from the end surfaces 119a and 119b as the emitting light.

The contact layer 107 is formed on the second cladding layer 106 as shown in FIGS. 1 and 3. As the contact layer 107, for example, a p-type GaN layer may be used. The contact layer 107 may have contact with the second electrode 122 at the contact surface 107a and makes an ohmic contact with the second electrode 122. As a result, it is possible to reduce a contact resistance of the second electrode 122.

Although not shown in the drawings, an etch-stop layer or a carrier stopping layer may be formed in between the second cladding layer 106 and the guiding layer 116. The etch-stop layer can improve an accuracy of the depth of the ridge waveguide. The carrier stopping layer can act to reduce an effect of mobility difference between electrons and holes on the radiative recombination rate.

Part of the second cladding layer 106 and the contact layer 107 may compose the columnar portion 108. In a portion included in the columnar portion 108, an effective refractive index can increase in comparison with the portions other than the columnar portion as described below. As a result, it is possible to form a waveguide 119 by confining light in a planar direction (for example, a direction perpendicular to a thicknesswise direction of the active layer 115). That is, the plane shape of the waveguide 119 can be determined based on a plane shape of the columnar portion 108. As described below, the second electrode 122 is formed on the contact layer 107. The plane shape of the contact surface 107a of the contact layer 107 having contact with the second electrode 122 may be the same as the plane shape of the columnar portion 108, that is, the plane shape of the waveguide 119. In other words, as seen in a plan view, a direction connecting the center of the end surface of the contact surface 107a on the first side surface 110a side and on the second side surface 110b side may be approximately equal to the direction of the longer sides of at least one of the first and second fine-wall-shape members 112 and 113 of the waveguide 119. In addition, it is possible to prevent a current from diffusing in a planar direction as described below using the columnar portion 108 (by confining the current in a planar direction) and to determine a current path between the electrodes 120 and 122. Although not shown in the drawings, the side surface of the columnar portion 108 may be inclined.

As shown in FIGS. 1 and 3, the insulation member 109 may be disposed on the second cladding layer 106 and on the lateral side of the columnar portion 108. The insulation member 109 may have contact with the side surface of the columnar portion 108. As shown in FIG. 3, for example, the upper surface of the insulation member 109 may be continuously connected to the upper surface of the contact layer 107. The insulation member 109 may be made of, for example, SiN, $SiO_2$, polyimide, or the like. As the insulation member 109 is made of such materials, the current between electrodes 120 and 122 may flow to the columnar portion 108 interposed between the insulation members 109 avoiding the insulation member 109. The insulation member 109 may have a refractive index smaller than that of second cladding layer 106. In this case, an effective refractive index of the vertical cross section of a portion including the insulation member 109 is smaller than that of a portion excluding the insulation member 109, that is, the portion including the columnar portion 108. As a result, it is possible to effectively confine light within the waveguide 119 in a planar direction. In addition, although not shown in the drawings, the insulation member 109 may not be provided. It may be explained that the insulation member 109 is air.

The first electrode 120 is formed on the entire bottom surface of the substrate 102. The first electrode 120 may have contact with a layer making an ohmic contact with the first electrode 120 (in the illustrated example, the substrate 102). The first electrode 120 is electrically connected to the first cladding layer 104 through the substrate 102. The first electrode 120 is one of the electrodes for driving the light-emitting device 100. For example, the first electrode 120 may be obtained by sequentially stacking a Ti layer, an Al layer, and an Au layer from the side of the substrate 102, or the like.

In addition, a second contact layer (not shown) may be provided between the first cladding layer 104 and the substrate 102, and the second contact layer may be exposed through dry etching or the like to provide a first electrode 120 on the second contact layer. As a result, it is possible to obtain a single-sided electrode structure. This structure is particularly effective in a case where a part of the substrate 102 is insulative as in the GaN template substrate obtained by growing the GaN layer on the sapphire substrate.

The second electrode 122 is formed on the contact layer 107. In addition, the second electrode 122 may be provided on the insulation member 109 as shown in FIG. 3. The second electrode 122 is electrically connected to the second cladding layer 106 through the contact layer 107. For example, the interval between the second electrode 122 and the active layer 115 may be smaller than the interval between the first electrode 120 and the active layer 115. The second electrode 122 is the other electrode for driving the light-emitting device 100. For example, the second electrode 122 may be obtained by sequentially stacking a Ni layer, a Pd layer, an Au layer from the side of the contact layer 107, or the like.

The light-emitting device 100 described above may be applied, for example, to a light source of a projector, a display, an illumination apparatus, a measurement apparatus, or the like.

The light-emitting device 100 according to the embodiment of the invention has, for example, the following characteristics.

In the light-emitting device 100, the semiconductor member 118 is formed between the first and second fine-wall-shape members 112 and 113. Therefore, it is possible to suppress a non-radiative recombination on the side surfaces of the first and second fine-wall-shape members 112 and 113. Therefore, in the light-emitting device 100, it is possible to obtain high light-emitting efficiency while strain between the substrate 102 and the semiconductor body 110 is relaxed. For example, when the side surface of the fine-wall-shape member is exposed, a non-radiative recombination occurs due to an impurity or a defect in the vicinity of the side surface so that the light-emitting efficiency may be degraded.

Furthermore, in the light-emitting device 100, the semiconductor member 118 is made of InGaN, and the first and second fine-wall-shape members 112 and 113 are made of, for example, InGaN. For this reason, compared to a case where an insulation member made of silicon oxide or polyimide is formed between the fine-wall-shape members 112 and 113, a thermal expansion coefficient of the fine-wall-shape members 112 and 113 and the semiconductor member 118 can be close to each other. Therefore, in the light-emitting device 100, for example, even when heat is generated by a current injection, it is possible to reduce a stress applied to the semiconductor body 110 due to thermal expansion, and it is possible to suppress degradation of light-emitting efficiency or reduction of lifetime caused by the stress. This is similarly applied to a case where the active layer 115 is made of InGaN, and the guiding layers 114 and 116 are made of GaN.

In the light-emitting device 100, as seen in a plan view, the contact surface 107a is arranged to extend from the first side surface 110a to the second side surface 110b, and at least one of the first and second fine-wall-shape members 112 and 113 (both in the illustrated example) may be arranged to extend from the first side surface 110a to the second side surface 110b within the contact surface 107a. As a result, the light generated in the active layer 115 can be emitted from the emitting surfaces 119a and 119b without precisely adjusting a refractive index of the semiconductor member 118. For example, although not shown in the drawings, in a case where the contact surface 107a is provided to extend from the third side surface 110c to the fourth side surface 110d, and the fine-wall-shape members 112 and 113 are provided to extend from the first side surface 110a to the second side surface 110b as seen in a plan view, the directions of the longer sides of the fine-wall-shape members 112 and 113 are different from the propagating direction of the light (waveguiding direction) so that the light generated in the active layer 115 propagates by alternately passing through the fine-wall-shape member 111 and the semiconductor member 118. For this reason, it is necessary to adjust the refractive index of the semiconductor member 118 so that a difference of the effective refractive index between the semiconductor member 118 and the fine-wall-shape member 111 can be reduced. As a result, since an allowable range of the value x in a composition of $In_xGa_{1-x}N$ of the semiconductor member 118 is reduced, it maybe difficult to form the semiconductor member 118. On the other hand, in the light-emitting device 100 according to the embodiment of the invention, it is possible to increase an allowable range of the value x, so that the semiconductor member 118 can be readily formed without precisely adjusting the refractive index as described above.

In the light-emitting device 100, the semiconductor member 118 may also be formed on the opposite side of the first fine-wall-shape member 112 to the second fine-wall-shape member 113 (on the side toward the second side surface 110b) and the opposite side of the second fine-wall-shape member 113 to the first fine-wall-shape member 112 (on the side toward the first side surface 110a). For this reason, it is possible to more effectively suppress a non-radiative recombination in the side surface of the fine-wall-shape members 112 and 113.

The light-emitting device 100 may be a super-luminescent diode. Therefore, the light-emitting device 100 can suppress laser oscillation and reduce speckle noise when it is used as a light source in an image projection apparatus such as a projector or an image display apparatus.

In the light-emitting device 100, the anti-reflection layer 130 may be formed to cover the end surfaces 119a and 119b of the waveguide 119. As a result, it is possible to reduce the reflectance on the end surfaces 119a and 119b which provide emitting surfaces. Therefore, it is possible to prevent multiple reflection of light between the end surfaces 119a and 119b. As a result, it is possible to suppress laser oscillation between the end surfaces 119a and 119b.

In the light-emitting device 100, the quantum well layer of the active layer 115 may be made of $In_xGa_{1-x}N$ ($0.4 \leq x \leq 0.6$). As a result, the light-emitting device 100 can emit green light.

In the light-emitting device 100, the semiconductor member 118 may be undoped, and the first and second guiding layers 114 and 116 of the fine-wall-shape member 111 may be doped. As a result, the injection carrier can flow into the fine-wall-shape member 111 avoiding the semiconductor member 118.

2. Method of Manufacturing Light-Emitting Device

Next, a method of manufacturing a light-emitting device according to an embodiment of the invention will be described with reference to the accompanying drawings. FIGS. 4 to 8 are perspective views schematically illustrating a manufacturing process of the light-emitting device 100 according to the embodiment of the invention.

Figure 4:
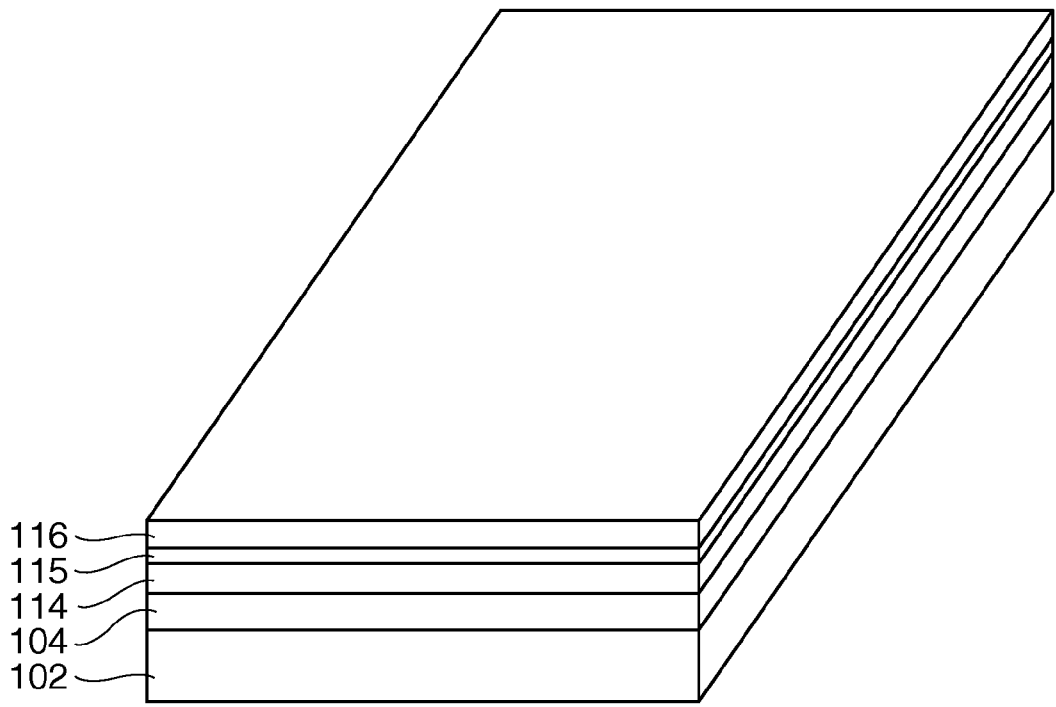
FIG. 4 is a perspective view schematically illustrating a process of manufacturing a light-emitting device according to an embodiment of the invention.

As shown in FIG. 4, the first cladding layer 104, the first guiding layer 114, the active layer 115, and the second guiding layer 116 are epitaxially grown on the substrate 102 in this order. The epitaxial growth method may include, for example, a metal organic chemical vapor deposition (MOCVD) method and a molecular beam epitaxy (MBE) method.

Figure 5:
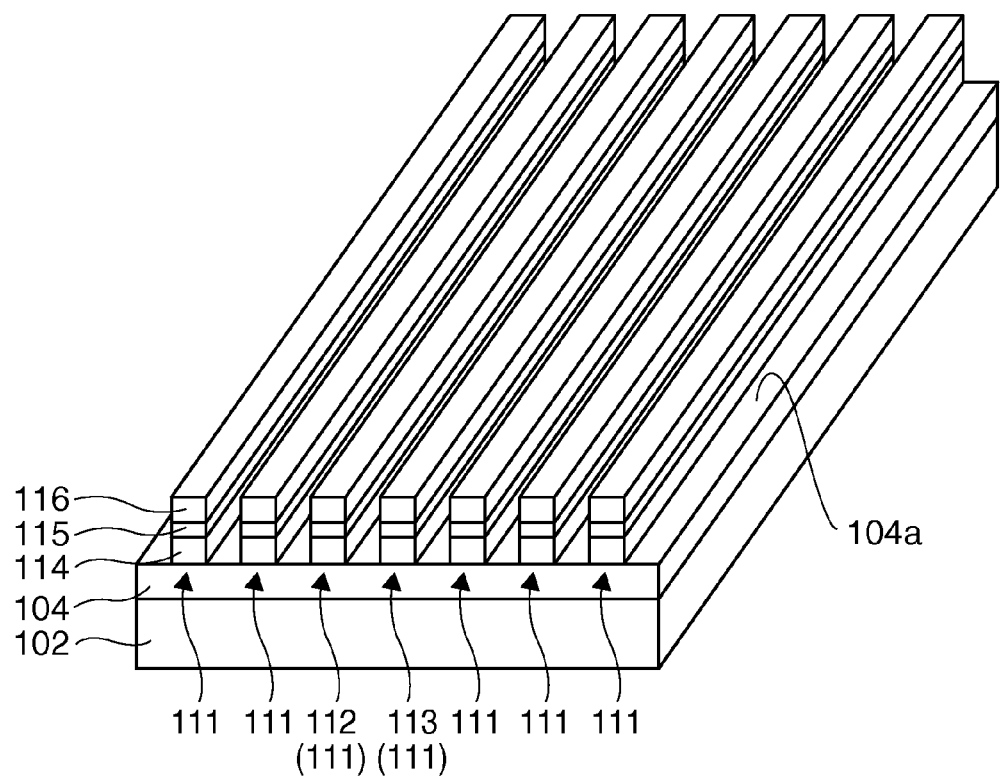
FIG. 5 is a perspective view schematically illustrating a process of manufacturing a light-emitting device according to the embodiment of the invention.

As shown in FIG. 5, the fine-wall-shape member 111 is formed by patterning the second guiding layer 116, the active layer 115, and the first guiding layer 114. The patterning may be performed, for example, using a photolithography technique and an etching technique. In the illustrated example, the patterning is performed to expose part of the upper surface 104a of the first cladding layer 104.

Figure 6:
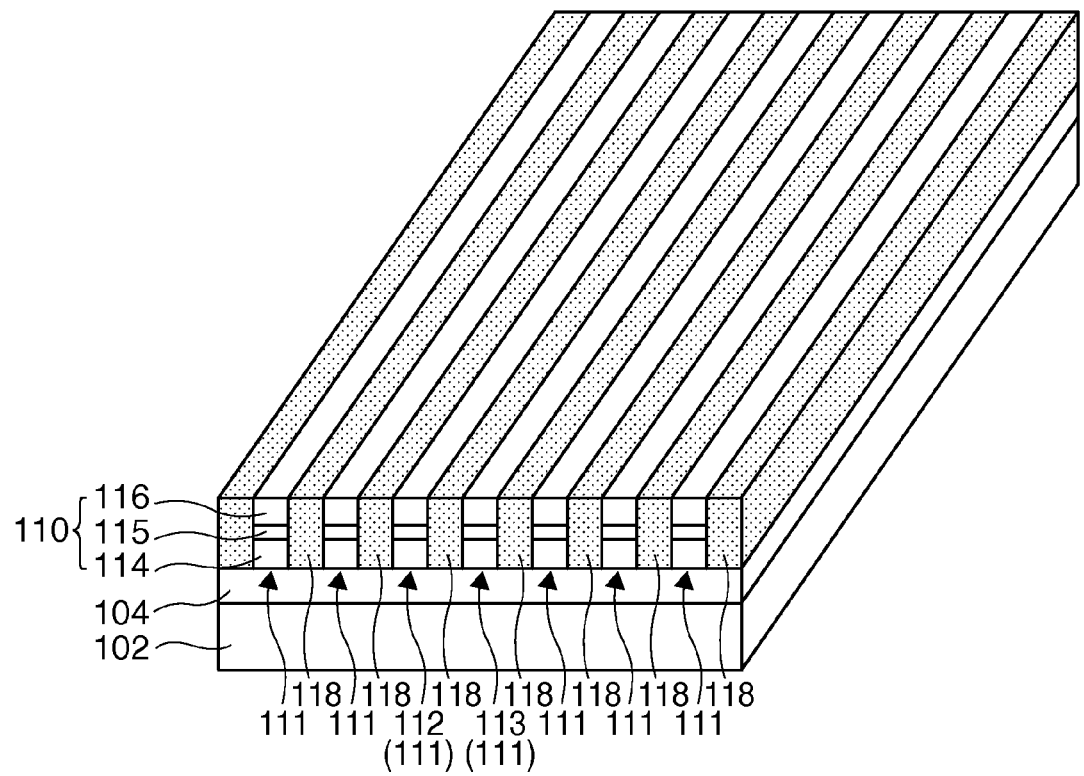
FIG. 6 is a perspective view schematically illustrating a process of manufacturing a light-emitting device according to the embodiment of the invention.

As shown in FIG. 6, the semiconductor member 118 is formed on the lateral side of the fine-wall-shape member 111 on the upper surface 104a of the exposed first cladding layer 104. As a result, it is possible to form the semiconductor body 110. The semiconductor member 118 may be formed such that the upper surface of the semiconductor member 118 is continuously connected to the upper surface of the fine-wall-shape member 111. The semiconductor member 118 is formed by an epitaxial lateral overgrowth (ELO), for example, using an MOCVD method. In the growth of InGaN included in the semiconductor member 118, the growth of rate the transverse direction (for example, a direction orthogonal to the thicknesswise direction of the active layer 115) is significantly faster than that of the stacking direction (for example, a thicknesswise direction of the active layer 115), which allows a gap between the fine-wall-shape members 111 to be filled relatively readily. Specifically, even when the interval between the neighboring fine-wall-shape members 111 ranges from several tens to hundreds of nanometers, it is possible to more readily fill the gap with the semiconductor member 118 without vacancy by using an ELO in comparison with a chemical vapor deposition (CVD) method or a sputtering method. Furthermore, it is possible to improve crystal quality of the semiconductor member 118 by using an ELO.

Figure 7:
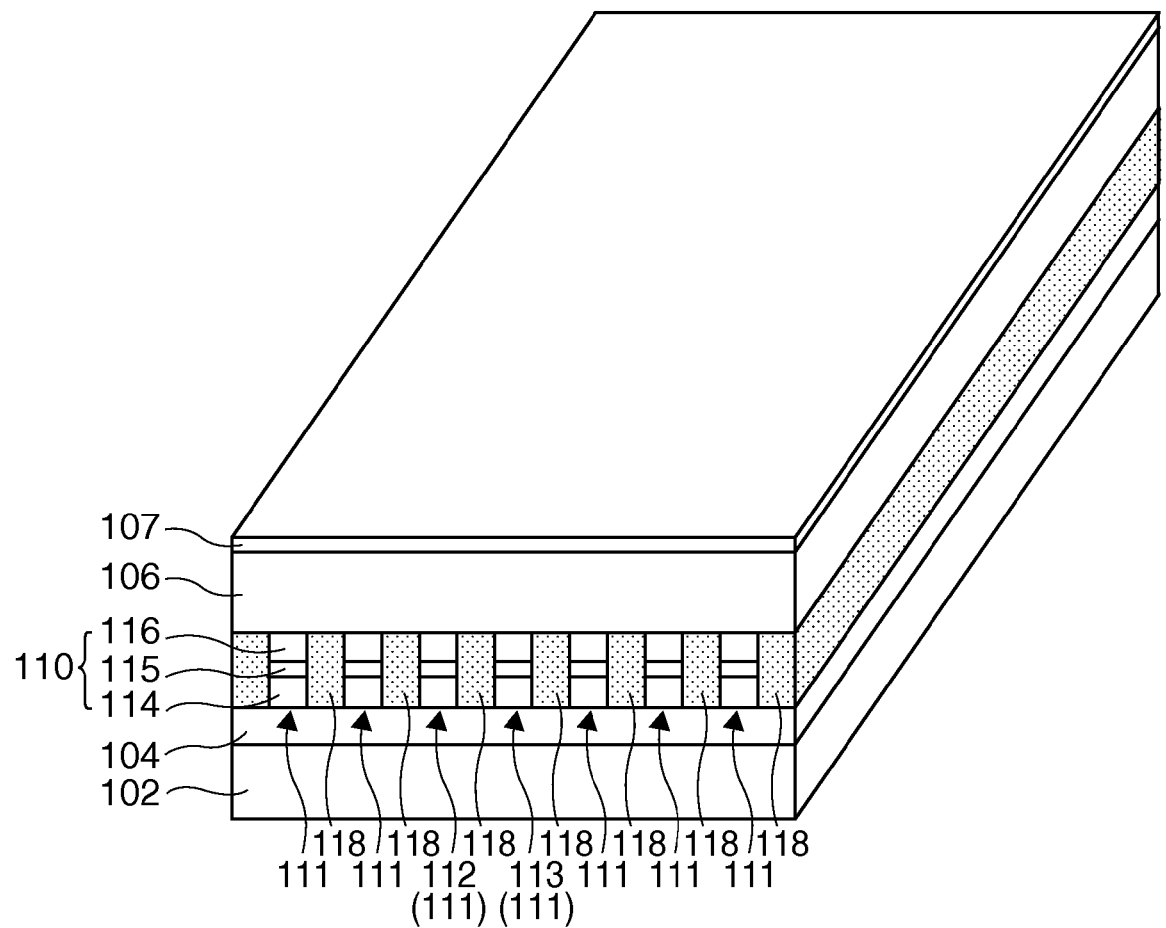
FIG. 7 is a perspective view schematically illustrating a process of manufacturing a light-emitting device according to the embodiment of the invention.

As shown in FIG. 7, the second cladding layer 106 and the contact layer 107 are epitaxially grown on the semiconductor body 110 in this order. A method of the epitaxial growth may include, for example, a MOCVD method and an MBE method.

Figure 8:
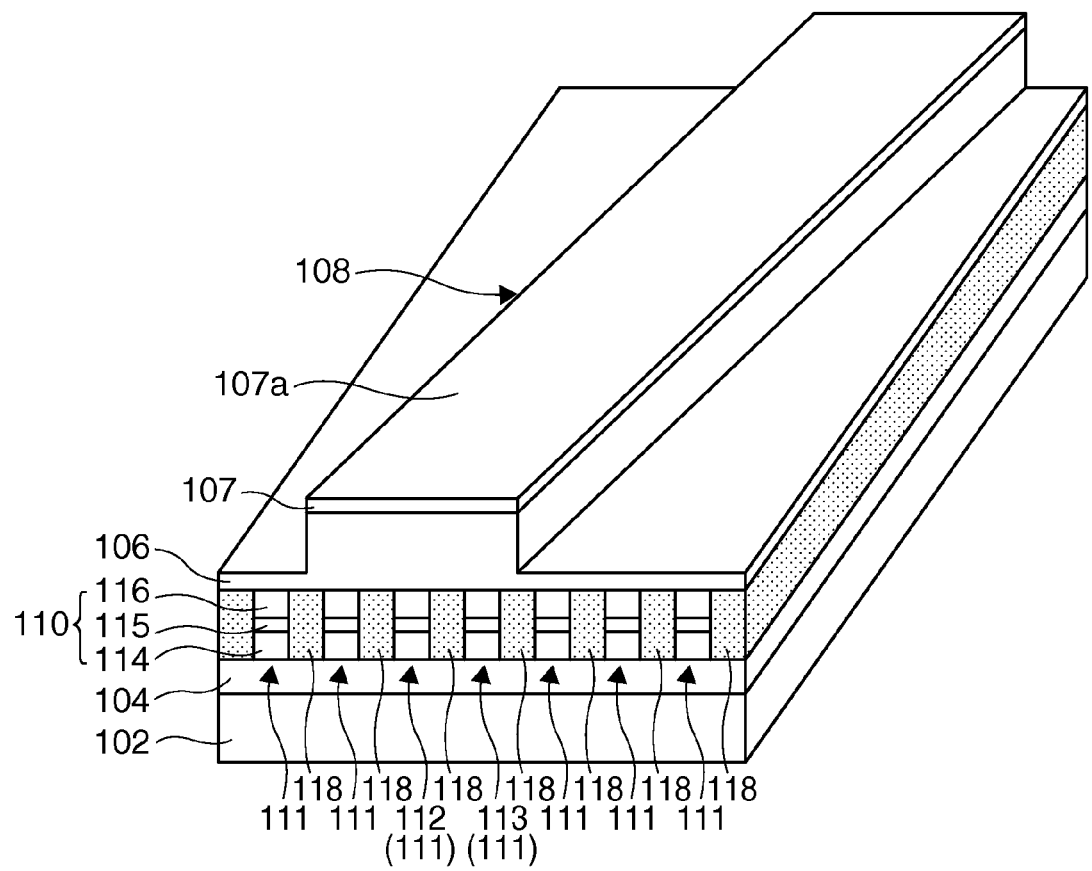
FIG. 8 is a perspective view schematically illustrating a process of manufacturing a light-emitting device according to the embodiment of the invention.

As shown in FIG. 8, at least the contact layer 107 and part of the second cladding layer 106 are patterned to form the columnar portion 108. The patterning is carried out, for example, using a photolithographic technique and an etching technique. In the illustrated example, the patterning is carried out not to expose the upper surface of the semiconductor body 110.

As shown in FIG. 1, the insulation member 109 is formed to cover the side surface of the columnar portion 108. Specifically, first, for example, the insulation layer (not shown) is formed on the upper side (including the contact layer 107) of the second cladding layer 106 using a CVD method or a coating method. Next, for example, the upper surface of the contact layer 107 is exposed using an etching technique or the like. Through the aforementioned process, it is possible to form the insulation member 109. The second electrode 122 is formed on the contact layer 107 and the insulation member 109 as shown in FIG. 3. The second electrode 122 is formed, for example, using a vacuum deposition method.

Next, the first electrode 120 is formed on the lower surface of the substrate 102. The first electrode 120 is formed, for example, using a vacuum deposition method. The sequence of forming the first electrode 120 and the second electrode 122 is not particularly limited.

As shown in FIG. 2, the anti-reflection layer 130 is formed on the first and second side surfaces 110a and 110b of the semiconductor body 110. The anti-reflection layer 130 is formed, for example, using a CVD method, a sputtering method, an ion assisted deposition method, or the like.

Through the aforementioned process, it is possible to manufacture the light-emitting device 100.

By the aforementioned manufacturing method, it is possible to manufacture the light-emitting device 100 having high light-emitting efficiency.

3. Modified Example of Light-emitting Device

Figure 9:
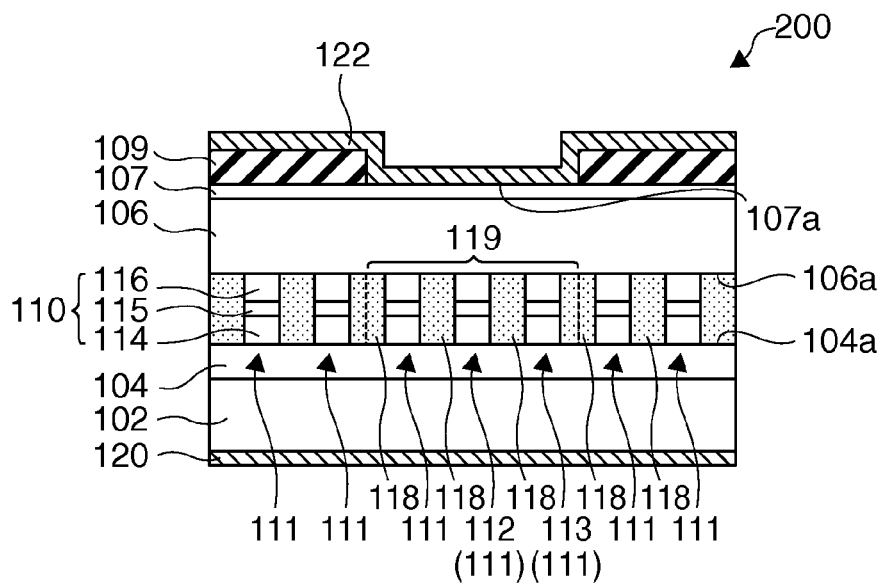
FIG. 9 is a cross-sectional view schematically illustrating a light-emitting device according to a modified example of the invention.

Next, a light-emitting device according to a modified example of the embodiment will be described with reference to the accompanying drawings. FIG. 9 is a cross-sectional view schematically illustrating a light-emitting device 200 according to a modified example of the invention, and corresponds to FIG. 3. Hereinafter, a light-emitting device 200 according to a modified example of the invention will be described with reference to the accompanying drawings, in which like reference numerals denote like elements as in the light-emitting device 100 according to the embodiment of the invention, and description thereof will not be repeated.

In the example of the light-emitting device 100, as shown in FIG. 3, an index-guiding type has been described in which a refractive index difference is provided between the area of the insulation member 109 and the area where the insulation member 109 is not provided, that is, the area of the columnar portion 108. In contrast, the light-emitting device 200 may be a gain-guiding type in which the columnar portion 108 is not formed, and a refractive index difference is not provided in the planar direction.

That is, in the light-emitting device 200, as shown in FIG. 9, the contact layer 107 and the second cladding layer 106 do not form the columnar portion, so that it is unnecessary to form the insulation member 109 on the lateral side of the columnar portion. In the light-emitting device 200, the insulation member 109 is formed on the contact layer 107 other than the upper side of the portion corresponding to the waveguide 119. That is, the insulation member 109 has an opening section over the portion corresponding to the waveguide 119, and the opening exposes the upper surface of the contact layer 107 is exposed at the opening section. The second electrode 122 is formed on the exposed contact layer 107 and the insulation member 109. In the illustrated example, the planar shape of the contact surface 107a of the contact layer 107 having contact with the second electrode 122 determines the current path between the electrodes 120 and 122. As a result, the planar shape of the waveguide 119 is determined as seen in a plan view. The contact surface 107a has the same planar shape as that of the waveguide 119. In addition, although not shown in the drawings, it is possible that the second electrode 122 is formed only on the contact layer 107 over the waveguide 119 and is not formed on the insulation member 109.

Similar to the light-emitting device 100, the light-emitting device 200 can be used to obtain high light-emitting efficiency.

4. Projector

Figure 10:
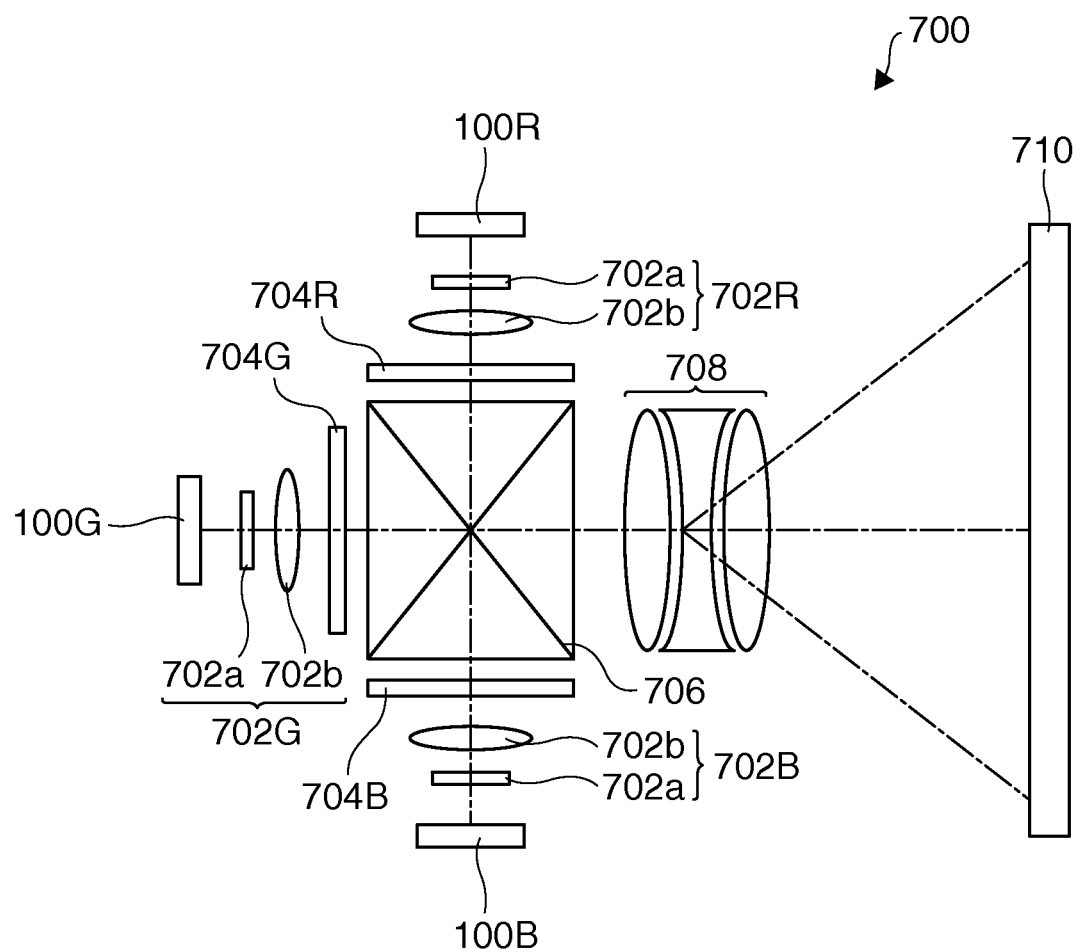
FIG. 10 is a diagram schematically illustrating a projector according to an embodiment of the invention.

Next, a projector 700 according to an embodiment of the invention will be described. FIG. 10 is a diagram schematically illustrating a projector 700. In addition, in FIG. 10, a case of the projector 700 is omitted for simplicity purposes. The projector 700 has the light-emitting device according to the embodiment of the invention. Hereinafter, an example in which the light-emitting device 100 is used as the light-emitting device according to the embodiment of the invention will be described.

The projector 700 may include a red light source (light-emitting device) 100R, a green light source (light-emitting device) 100G, and a blue light source (light-emitting device) 100B emitting red light, green light, and blue light, respectively. Out of these, at least the green light source 100G corresponds to the aforementioned light-emitting device 100.

The projector 700 includes transmissive liquid crystal light valves (optical modulators) 704R, 704G, and 704B for modulating respective light emitting from the light sources 100R, 100G, and 100B, respectively, based on image information, and a projection lens (projection device) 708 for projecting images formed by the liquid crystal light valves 704R, 704G, and 704B onto a screen (display surface) 710 by magnification. Furthermore, the projector 700 may include a cross dichroic prism (color light synthesizing unit) 706 for synthesizing the each colored light emitting from the liquid crystal light valves 704R, 704G, and 704B and guiding the light into the projection lens 708.

In addition, the projector 700 can include homogenizing optical systems 702R, 702G, and 702B in the downstream of the optical path from the light sources 100R, 100G, and 100B, respectively, in order to homogenize an illumination distribution of the light emitting from the light sources 100R, 100G, and 100B. As a result, the liquid crystal light valves 704R, 704G, and 704B are illuminated with the light of which the illumination distribution is homogenized. The homogenizing optical systems 702R, 702G, and 702B are configured by, for example, a hologram 702a and a field lens 702b.

Three colored light beams modulated by the liquid crystal light valves 704R, 704G, and 704B enter the cross dichroic prism 706. The cross dichroic prism 706 is formed by bonding four rectangular prisms, and a dielectric multi-layer film for reflecting red light and a dielectric multi-layer film for reflecting blue light are arranged in a cross shape on the surface thereof. The three colored light beams are synthesized by such dielectric multi-layer films so as to form light representing color image. Then, the synthesized light is projected onto a screen 710 by the projection lens 706 and thus a magnified image is displayed.

The projector 700 can have a green light source 100G having high light-emitting efficiency. Accordingly, the projector 700 can also provide high conversion efficiency of light from electricity as a whole.

Although a transmissive liquid crystal light valve is used as the optical modulator in the aforementioned example, light valves other than the liquid crystal light valve or reflective light valves may be used. Such a light valve may include, for example, a reflective liquid crystal light valve or a digital micro mirror device. In addition, the configuration of the projection optical system can be appropriately modified according to the type of the light valve used.

In addition, the light sources 100R, 100G, and 100B can be used as the light source of a scanning type image display apparatus (projector) which has a scanning unit as an image forming device for displaying an image with a desired size on a display surface by scanning light from the light source onto the screen.

The aforementioned embodiments and the modified examples are just exemplary and not intended to limit the invention. For example, each embodiment and each modified example may be combined in an appropriate form.

Although the embodiments of the invention have been described in detail above, it would be readily appreciated by those skilled in the art that they may be variously modified without substantially departing from novel concepts and effects. Therefore, it is intended that such modified examples are included in the scope of the invention.

The entire disclosure of Japanese Patent Application No. 2010-133681, filed Jun. 11, 2010 is expressly incorporated by reference herein.

What is claimed is:

1. A light-emitting device comprising:
a first layer having a first surface;
a second layer having a second surface that faces the first surface; and
a semiconductor body interposed between the first and second surfaces,
wherein the semiconductor body has a first fine-wall-shape member, a second fine-wall-shape member, and a semiconductor member,
the first and second fine-wall-shape members having
a third layer adjacent to the first surface,
a fourth layer adjacent to the second surface, and
a fifth layer interposed between the third and fourth layers,
the semiconductor member is interposed between the first and second fine-wall-shape members,
the first and second layers are made of GaN,
the third, fourth, and fifth layers and the semiconductor member are made of $In_xGa_{1-x}N(0<x<1)$,
a value x of the fifth layer is larger than values x of the third and fourth layers and the semiconductor member,
the fifth layer is a layer that generates light and guides the light,
the third and fourth layers are layers that guide the light generated in the fifth layer,
the first and second layers are layers that suppress leakage of the light generated in the fifth layer,
the semiconductor body has a third surface connecting the first and second surfaces and a fourth surface connecting the first and second surfaces and facing the third surface, the first and second fine-wall-shape members are arranged to extend from the third surface to the fourth surface as seen in a plan view from a normal direction of the first surface,
at least one of the third and fourth surfaces is provided with an emitting surface,
at least one of the first and second fine-wall-shape members, and the semiconductor member configure at least part of the emitting surface, and
the emitting surface emits the light generated in the fifth layer.

2. The light-emitting device according to claim 1, further comprising:
a first electrode electrically connected to the first layer;
a second electrode electrically connected to the second layer; and
a sixth layer formed between the second layer and the second electrode,
wherein the sixth layer makes an ohmic contact with the second electrode,
a contact surface between the sixth layer and the second electrode is arranged to extend from the third surface to the fourth surface as seen in a plan view from a normal direction of the first surface, and
at least one of the first and second fine-wall-shape members is provided within the contact surface extending from the third surface to the fourth surface as seen in a plan view from a normal direction of the first surface.

3. The light-emitting device according to claim 1, wherein the semiconductor member is formed on the opposite side of the first fine-wall-shape member to the second fine-wall-shape member and the opposite side of the second fine-wall-shape member to the first fine-wall-shape member.

4. The light-emitting device according to claim 1, further comprising a seventh layer formed to cover the emitting surface, wherein the seventh layer is a layer that suppresses reflection of the light generated in the fifth layer.

5. The light-emitting device according to claim 1, wherein a value x of the fifth layer is equal to or larger than 0.4 and equal to or smaller than 0.6.

6. The light-emitting device according to claim 1, wherein the third layer is doped with a first conductivity type, and the fourth layer is doped with a second conductivity type, and the semiconductor member is undoped.

7. A projector comprising:
the light-emitting device according to claim 1;
an optical modulator that modulates the light emission from the light-emitting device based on image information; and
a projection device that projects an image formed by the optical modulator.

8. A light-emitting device comprising:
a first layer having a first surface;
a second layer having a second surface that faces the first surface; and
a semiconductor body interposed between the first and second surfaces,
wherein the semiconductor body has a first fine-wall-shape member, a second fine-wall-shape member, and a semiconductor member,
the first and second fine-wall-shape members having
a third layer adjacent to the first surface,
a fourth layer adjacent to the second surface, and
a fifth layer interposed between the third and fourth layers,
the semiconductor member is interposed between the first and second fine-wall-shape members, the first and second layers are made of AlGaN,
the third and fourth layers are made of GaN,
the fifth layer and the semiconductor member are made of $In_xGa_{1-x}N$ ($0<x<1$),
a value x of the fifth layer is larger than a value x of the semiconductor member,
the fifth layer is a layer that generates light and guides the light,
the third and fourth layers are layers that guide the light generated in the fifth layer,
the first and second layers are layers that suppress leakage of the light generated in the fifth layer,
the semiconductor body includes a third surface connecting the first and second surface and a fourth surface connecting the first and second surfaces and facing the third surface,
the first and second fine-wall-shape members are arranged to extend from the third surface to the fourth surface as seen in a plan view from a normal direction of the first surface,
at least one of the third and fourth surfaces is provided with an emitting surface,
at least one of the first and second fine-wall-shape members, and the semiconductor member configure at least apart of the emitting surface, and
the emitting surface emits the light generated in the fifth layer.

9. The light-emitting device according to claim 8, further comprising:
a first electrode electrically connected to the first layer;
a second electrode electrically connected to the second layer; and
a sixth layer formed between the second layer and the second electrode,
wherein the sixth layer makes an ohmic contact with the second electrode,
a contact surface between the sixth layer and the second electrode is arranged to extend from the third surface to the fourth surface as seen in a plan view from a normal direction of the first surface, and
at least one of the first and second fine-wall-shape members is provided within the contact surface extending from the third surface to the fourth surface as seen in a plan view from a normal direction of the first surface.

10. The light-emitting device according to claim 8, wherein the semiconductor member is formed on the opposite side of the first fine-wall-shape member to the second fine-wall-shape member and the opposite side of the second fine-wall-shape member to the first fine-wall-shape member.

11. The light-emitting device according to claim 8, further comprising a seventh layer formed to cover the emitting surface, wherein the seventh layer is a layer that suppresses reflection of the light generated in the fifth layer.

12. The light-emitting device according to claim 8, wherein a value x of the fifth layer is equal to or larger than 0.4 and equal to or smaller than 0.6.

13. The light-emitting device according to claim 8, wherein the third layer is doped with a first conductivity type, and the fourth layer is doped with a second conductivity type, and the semiconductor member is undoped.

14. A projector comprising:
the light-emitting device according to claim 8;
an optical modulator that modulates the light emission from the light-emitting device based on image information; and
a projection device that projects an image formed by the optical modulator.

15. A light-emitting device comprising:
a first layer;
a plurality of wall-shape members that has a longitudinal shape elongated in an in-plane direction of the first layer and is arranged on the first layer in a direction perpendicular to the longitudinal direction of the longitudinal shape;
a semiconductor member that is made of $In_xGa_{1-x}N$ ($0<x<1$) and provided between a plurality of the wall-shape members; and
a second layer disposed on a plurality of the wall-shape members and the semiconductor member,
wherein the wall-shape member is obtained by sequentially stacking a first guiding layer, a light-emitting layer, and a second guiding layer in a direction normal to an in-plane direction of the first layer,
the light-emitting layer is a layer that is made of $In_yGa_{1-y}N$ ($0<x<y<1$) and generates light,
the first and second guiding layers are layers that guide the light generated in the light-emitting layer,
the first and second layers are layers that suppress leakage of the light generated in the light-emitting layer, and
at least one end portion of a plurality of the wall-shape members is intersected with the longitudinal direction and has an emitting surface that emits light.

16. A projector comprising:
the light-emitting device according to claim 15;
an optical modulator that modulates the light emission from the light-emitting device based on image information; and
a projection device that projects an image formed by the optical modulator.

* * * * *